(12) United States Patent
Uchida

(10) Patent No.: US 9,146,460 B2
(45) Date of Patent: Sep. 29, 2015

(54) IMPRINTING METHOD AND APPARATUS THEREFOR

(75) Inventor: Shinji Uchida, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 284 days.

(21) Appl. No.: 12/427,886

(22) Filed: Apr. 22, 2009

(65) Prior Publication Data

US 2010/0025878 A1 Feb. 4, 2010

(30) Foreign Application Priority Data

Apr. 22, 2008 (JP) ................. 2008-111762

(51) Int. Cl.
| | |
|---|---|
| B29C 59/02 | (2006.01) |
| G03F 7/00 | (2006.01) |
| B82Y 10/00 | (2011.01) |
| B82Y 40/00 | (2011.01) |
| G11B 5/74 | (2006.01) |
| G11B 5/855 | (2006.01) |

(52) U.S. Cl.
CPC ............... *G03F 7/0002* (2013.01); *B82Y 10/00* (2013.01); *B82Y 40/00* (2013.01); *G11B 5/743* (2013.01); *G11B 5/855* (2013.01)

(58) Field of Classification Search
CPC ..................................................... B29C 59/02
USPC ............................ 264/493; 425/440, 384–385
See application file for complete search history.

(56) References Cited

U.S. PATENT DOCUMENTS

| | | | | |
|---|---|---|---|---|
| 6,024,907 | A * | 2/2000 | Jagunich ........................ | 264/284 |
| 6,272,275 | B1 * | 8/2001 | Cortright et al. ............... | 385/129 |
| 6,322,342 | B1 | 11/2001 | Mitamura | |
| 7,343,857 | B2 | 3/2008 | Sakuarai et al. | |
| 2005/0116370 | A1 * | 6/2005 | Ogino et al. ................. | 264/40.1 |
| 2005/0158163 | A1 * | 7/2005 | Harper et al. ............... | 414/788.1 |

(Continued)

FOREIGN PATENT DOCUMENTS

| | | | |
|---|---|---|---|
| JP | 54108865 A | * | 8/1979 |
| JP | 2004-356560 A | | 12/2004 |

(Continued)

OTHER PUBLICATIONS

English abstract of JP2005186557.*

(Continued)

*Primary Examiner* — Christina Johnson
*Assistant Examiner* — Xue Liu
(74) *Attorney, Agent, or Firm* — Rossi, Kimms & McDowell LLP

(57) ABSTRACT

An imprinting method forms a pattern in a resist surface of a substrate coated with a thermoplastic resist by using a mold having a pattern of projections and recesses formed in a transfer surface. The method includes an alignment step, a heating step, a press step, a cooling step, and release step, wherein the steps are performed in a plurality of units selected from independent units, composite units, and combinations of independent units and composite units. A mold and a substrate are paired with each other and conveyed between the units. An imprinting apparatus includes a plurality of units which perform the steps in the imprinting method and which are selected from independent units, composite units, and combinations of independent units and composite units. Conveying devices are provided which convey the mold and the substrate paired with each other between the plurality of units.

5 Claims, 9 Drawing Sheets

(56) References Cited

U.S. PATENT DOCUMENTS

| | | |
|---|---|---|
| 2005/0248320 A1 | 11/2005 | Denning |
| 2006/0115584 A1 | 6/2006 | Hattori et al. |
| 2006/0245855 A1 | 11/2006 | Hamada |
| 2006/0286193 A1 | 12/2006 | Ando et al. |
| 2007/0077325 A1* | 4/2007 | Yu .................................. 425/385 |
| 2007/0200276 A1 | 8/2007 | Mackey et al. |
| 2008/0041816 A1 | 2/2008 | Choo |
| 2009/0261514 A1 | 10/2009 | Uchida |

FOREIGN PATENT DOCUMENTS

| | | |
|---|---|---|
| JP | 2005-056535 A | 3/2005 |
| JP | 2005-108351 A | 4/2005 |
| JP | 2005-135957 A | 5/2005 |
| JP | 2005-153091 A | 6/2005 |
| JP | 2005186557 A * | 7/2005 |
| JP | 2005-286222 A | 10/2005 |
| JP | 2006-062208 A | 3/2006 |
| JP | 2006-310698 A | 11/2006 |
| JP | 2006-326927 A | 12/2006 |
| JP | 2008-046580 A | 2/2008 |
| WO | WO 2004062886 A1 * | 7/2004 |

OTHER PUBLICATIONS

English abstract of JP54108865, 1979.*

Office Action issued in Japanese patent application No. JP2008-111761, issued Feb. 21, 2012. Partial English translation provided (Cited in co-pending U.S. Appl. No. 12/427,881).

Office Action issued in Japanese Patent Application 2008-111761 dated Oct. 5, 2012. Cited in related co-pending U.S. Appl. No. 12/427,881.

Japanese Office Action, "Notification of Reasons for Refusal", for corresponding JP 2008-111762, dated Apr. 27, 2012. Partial translation provided.

* cited by examiner

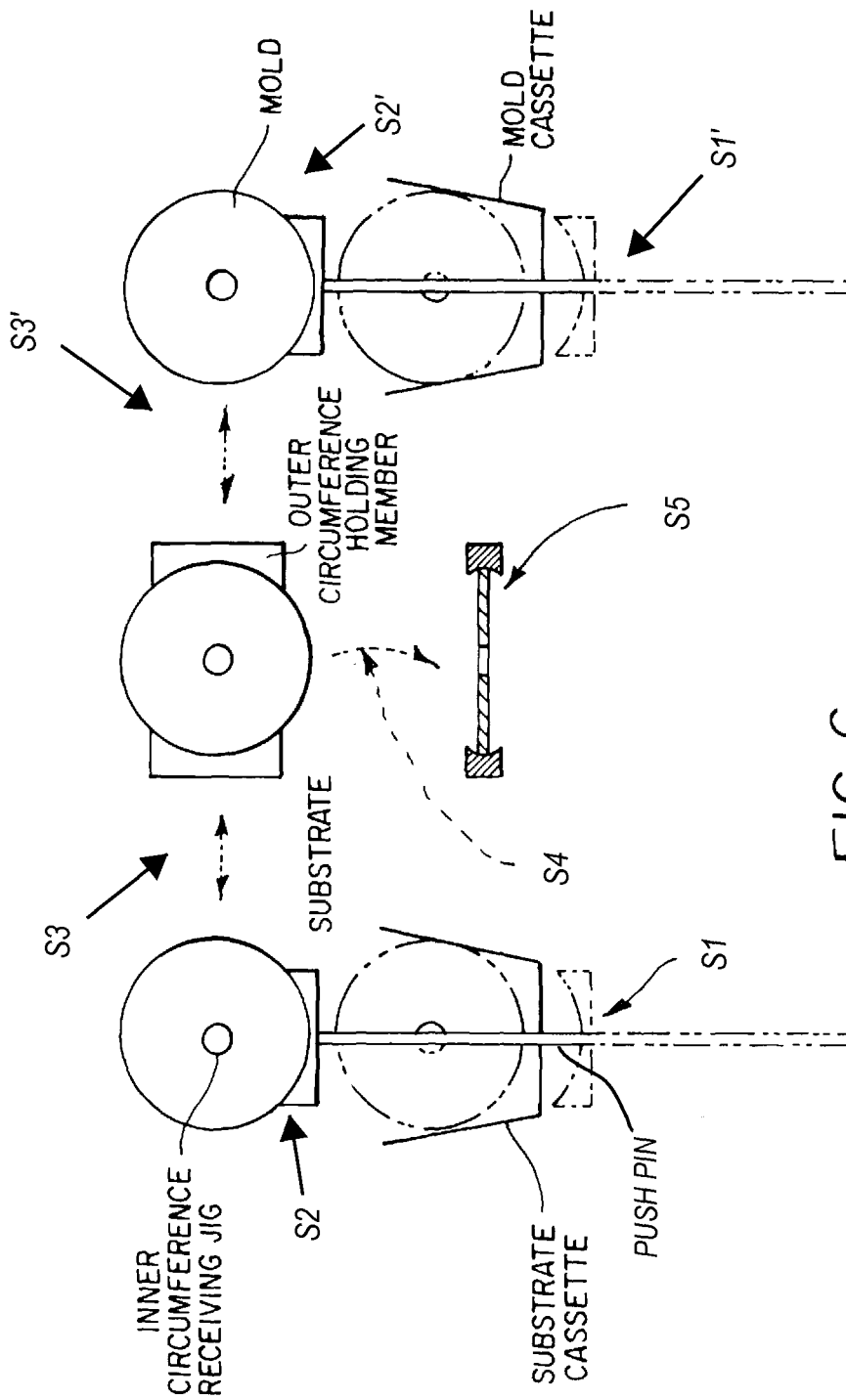

IMPRINTING METHOD AND APPARATUS THEREFOR

BACKGROUND

The present invention relates to an imprinting method and an apparatus therefor. Imprinting is a method in which a molding surface of a mold having very fine projections and recesses formed therein is pressed against a resin applied on a substrate to thereby transfer the shape of the molding surface to the resin.

In recent years, the capacities of hard disk drives have tended to increase and the recording densities of magnetic recording media have thus been increased. As track density increases in accordance with the increase in recording density, a leakage magnetic field is produced from a side surface of a head gap at the time of data writing. The leakage magnetic field causes production of noise to reduce S/N of a playback signal because unnecessary recording called 'side fringe' is performed on a region between adjacent tracks.

To avoid such a disadvantage, for example, a discrete track type magnetic recording medium having grooves provided between adjacent recording tracks has been proposed in JP-A-2005-56535. In the discrete track type magnetic recording medium, adjacent tracks are separated from each other so that the 'side fringe' problem can be avoided. On the other hand, a patterned medium has been proposed to form 1-bit dots on a disk for the purpose of improving recording density greater.

In either of the discrete track medium and the patterned medium, a minute pattern is formed on a disk. In most cases, the patterning is performed by an imprinting method. The imprinting method uses a mold having a minute pattern formed in a molding surface as a prototype mold for transferring the minute pattern to a surface of a substrate coated with a resin. Thermal imprinting using a thermoplastic resin and photo imprinting using a photo-setting resin are known as the imprinting method. Particularly, imprinting for forming a minute pattern with a nano-meter size is called 'nano-imprinting'.

In the thermal imprinting, a resist pattern is generally formed in the following process. First, after a substrate is placed on a stage, a thermoplastic resin or a thermosetting resin is applied on a surface of the substrate. Then, the substrate and a mold having a molding pattern formed therein are heated to a temperature not lower than a glass transition temperature (Tg) and the mold is pressed against the resist-coated surface of the substrate by a predetermined load. In this condition, the substrate and the mold are held for a predetermined time so that the pattern of the mold is transferred to the resist of the substrate. Then, the mold and the substrate are cooled to a temperature lower than Tg of the resist and the mold is released from the substrate. The substrate having the thermoplastic or thermosetting resin onto which a convex shape corresponding to the concave shape formed in the molding surface of the mold has been transferred is taken out from the stage.

An example of an imprinting apparatus made from three units, that is, a substrate setting unit, a resin coating unit and a processing unit has been disclosed in JP-A-2006-326927. The processing unit performs alignment of a transfer body with a stamper, pressurization and release. In this example, a conveyance robot is disposed in the center while the three units are disposed on the circumference of a circle with the conveyance robot as the center of the circle.

In nano-imprinting commonly known at present, all nano-imprinting steps are performed in one place in one apparatus. The nano-imprinting steps are an alignment step for aligning a pattern of a mold with a predetermined position of a substrate, a heating step for heating the mold and the substrate, a press step for pressing the patterned surface of the mold against a surface of a resist applied on the substrate, a cooling step for cooling the mold and the substrate and a release step for releasing the mold from the substrate.

That is, because a mold provided as an expensive prototype mold produced by electron beam exposure has been heretofore used, it may be said that substrates are one by one subjected to the series of nano-imprinting steps using one mold.

A tact time of 300 or more sheets per hour is however required of either of the discrete track medium and the patterned medium. The required tact time cannot be achieved if all the series of nano-imprinting steps are performed in one apparatus.

The imprinting apparatus disclosed in JP-A-2006-326927 is an apparatus in which: a substrate is set by the substrate setting unit; the substrate is conveyed to the resin coating unit and coated with a photosensitive resin; the substrate is conveyed to the processing unit and subjected to alignment of a transfer body with a stamper, pressurization and release; and the processed substrate is conveyed to the substrate setting unit again and taken out. In the imprinting apparatus, while a substrate is present in any one of the units, any other substrate cannot be loaded because the units are disposed on the circumference of a circle with the conveyance robot as the center of the circle so that the conveyance robot conveys the substrate between the units. For this reason, the configuration of the imprinting apparatus disclosed in JP-A-2006-326927 is the same as in the case where all the series of nano-imprinting steps are performed in one apparatus.

In recent years, it as been possible to produce a large number of clone molds inexpensively from a very expensive prototype mold (e.g. see JP-A-2005-286222). The use of the large number of clone molds has permitted each step to be performed on an assembly line while the mold and the substrate are paired with each other.

In view of the above, it would be desirable to provide a method for performing nano-imprinting efficiently, and an apparatus therefor. The invention was developed in consideration of such circumstances.

SUMMARY OF THE INVENTION

The imprinting method according to the invention is an imprinting method for forming a predetermined pattern in a resist surface of a substrate coated with a thermal imprint resist by using a mold having a pattern of projection and recesses formed in a transfer surface, including the steps of: aligning the pattern of the mold with a predetermined position of the substrate (alignment step); heating the mold and the substrate (heating step); pressing the patterned surface of the mold against the resist surface of the resist-coated substrate (press step); cooling the mold and the substrate (cooling step); and releasing the mold from the substrate (release step), wherein: the steps in the imprinting method are performed in a plurality of units selected from independent units in each of which one step is executed, composite units each of which a plurality of steps are executed, and combinations of independent units and composite units; and conveyance steps for conveying the mold and the substrate paired with each other between the units are provided between the units.

In addition, the imprinting apparatus according to the invention is an apparatus for carrying out the imprinting method, including: a plurality of units which perform the steps in the imprinting method and which are selected from independent units in each of which one step is executed, composite units each of which a plurality of steps are executed, and combinations of independent units and composite units; and conveying devices which convey the mold and the substrate paired with each other between the plurality of units.

According to the invention, a series of imprinting processes in production of discrete track media, patterned media, etc. are executed on an assembly line so that imprinting can be performed efficiently in a short tact time.

Other advantages, variations, modifications and embodiments of the invention will become apparent to those skilled in the art from the following detailed description of the preferred embodiments.

BRIEF DESCRIPTION OF THE DRAWINGS

The invention will be described with reference to certain preferred embodiments thereof and the accompanying drawings, wherein:

FIG. 6 is a view for explaining sandwich arrangement of a substrate and a mold in a loader unit;

DETAILED DESCRIPTION OF THE PREFERRED EMBODIMENTS

An imprinting method according to the invention will be described first. In the imprinting method according to the invention, a mold having a transfer surface provided with a pattern of projections and recesses formed therein and a substrate coated with a thermal imprint resist are used so that a predetermined pattern is formed in the resist surface of the substrate. The mold used herein is not an expensive prototype mold but one of a large number of clone molds copied from the prototype mold.

The imprinting method according to the invention includes the steps of: aligning a pattern of a mold with a predetermined position of a substrate (alignment step); heating the mold and the substrate (heating step); pressing the patterned surface of the mold against a surface of a resist applied on the substrate (press step); cooling the mold and the substrate (cooling step); and releasing the mold from the substrate (release step). Generally, a loading step for setting the mold and the substrate coated with the thermal imprint resist in an imprinting apparatus is provided before the alignment step, and an unloading step for taking out the mold and the substrate having a predetermined pattern formed in the resist surface and released from the mold by the release step is provided after the release step.

In the imprinting method, the steps are performed in a plurality of units selected from independent units in each of which one step is executed, composite units in each of which a plurality of steps are executed, and combinations of independent units and composite units.

Figure 1:
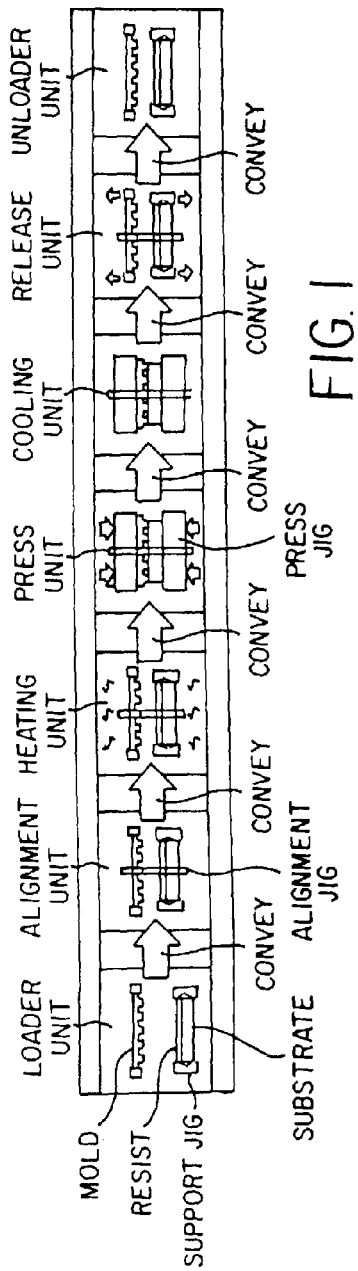
FIG. 1 is a view showing the configuration of an apparatus according to a first embodiment in which all steps are performed in independent units.

FIG. 1 shows an example in which all the steps are performed in independent units. First, a resist-coated substrate and a mold are loaded into a loader unit. Then, the substrate and the mold are conveyed to an alignment unit and aligned with each other in the alignment unit. Then, the substrate and the mold are conveyed to a heating unit and heated at a temperature not lower than Tg of the resist. Then, while the temperature is kept to be not lower than Tg, the substrate and the mold are conveyed to a press unit and the mold is pressed against the substrate in the press unit. Then, in the state where the substrate and the mold are stuck to each other, the substrate and the mold are conveyed to a cooling unit and cooled to a temperature not higher than Tg of the resist. Then, the mold and the substrate are conveyed to a release unit and the mold is released from the substrate in the release unit. Then, the substrate having the patterned resist and the mold are conveyed to an unloader unit and taken out from the unloader unit.

Figure 4:
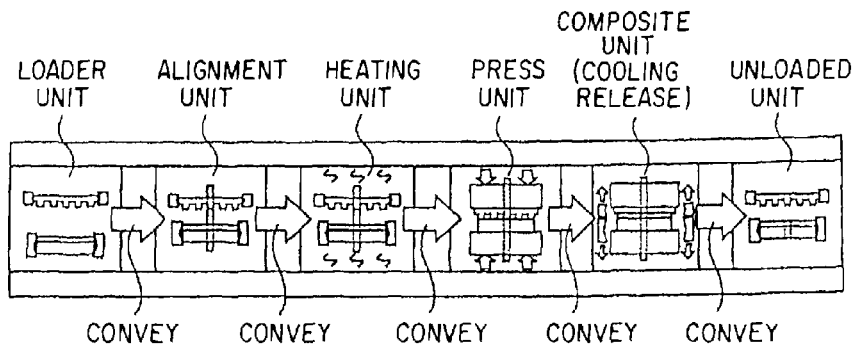
FIG. 4 is a view showing the configuration of an apparatus according to a fourth embodiment.

FIG. 4 shows an example in which the cooling step and the release step are carried out in one composite unit.

For example, when a resist material which can be thermally cured during hot pressing is used so that it does not take much time to cool the resist material because the temperature of the heated resist material is low, the tact time of the cooling unit is shortened. In this case, the cooling step and the release step can be performed in one unit. The configuration in which steps are performed in one composite unit is not limited to the example shown in FIG. 4 and any configuration may be used as long as the tact times of the respective units can be harmonized with one another. For example, the alignment step and the heating step may be carried out in one composite unit.

When the pitch of the resist pattern is about 100 nm, mold releasing can be performed relatively rapidly in the release step because defects little occur in the pattern. However, when the pitch of the resist pattern is not larger than 80 nm or when the depth of the pattern is twice or more as large as the pitch of the pattern, it is necessary to release the mold from the substrate to a perfectly separate position without adhesion strength at a relatively low speed of 0.01 mm/sec in order to prevent occurrence of defects in the pattern.

In addition, in the invention, preferably, a conveying device following the alignment unit conveys the mold and the substrate in the state where the mold and the substrate are stuck to each other. Conveyance of the mold and the substrate in the state where the mold and the substrate are stuck to each other permits the difference between the relative positions to be more suppressed when the mold and the substrate are conveyed.

In addition, in the invention, the press step may be carried out under a reduced atmosphere, preferably under reduced pressure of 1000 Pa or less. When the press step is performed under reduced pressure, voids can be prevented from being involved in the pattern. To perform the press step under a reduced atmosphere, a pressure reducing unit may be provided in or before the press unit while an air opening unit may be provided in or after the press unit.

Moreover, in the invention, a series of operations from loading into the loader unit to unloading from the unloader unit may be performed under reduced pressure. When all the steps are performed under reduced pressure, particles in the air can be restrained from being mixed into the pattern so that defects of the pattern caused by the particles and failure of the mold caused by the involved particles can be prevented. Voids can be prevented from being involved in the pattern. Although the scale of an apparatus for performing a series of operations from loading into the loader unit to unloading from the unloader unit under reduced pressure is large, these operations may be performed under reduced pressure in a series of apparatuses in which all these units and the conveying devices connecting these units are received.

The imprinting apparatus according to the invention will be described below with reference to the drawings.

The configuration of each unit will be described first on the case where the apparatus according to the invention is configured as shown in FIG. 1 by way of example. FIG. 1 is a schematic view showing an example of configuration of the apparatus according to the invention. The apparatus configured as shown in FIG. 1 includes a loader unit, an alignment unit, a heating unit, a press unit, a cooling unit, a release unit, and an unloader unit. The loader unit is provided to perform a loading step for setting a mold and a substrate coated with a thermal imprint resist into the imprinting apparatus. The alignment unit is provided to perform an alignment step for aligning a pattern of the mold with a predetermined position of the substrate. The heating unit is provided to perform a heating step for heating the mold and the substrate. The press unit is provided to perform a press step for forming the shape of a predetermined pattern in the resist surface of the substrate. The cooling unit is provided to perform a cooling step for cooling the mold and the substrate. The release unit is provided to perform a release step for releasing the mold from the substrate. The unloader unit is provided to perform an unloading step for taking out the substrate released from the mold and the mold. Conveying devices are provided between the loader unit and the alignment unit, between the alignment unit and the heating unit, between the heating unit and the press unit, between the press unit and the cooling unit, between the cooling unit and the release unit and between the release unit and the unloader unit, respectively.

The loader unit extracts substrates one by one from a substrate cassette, extracts molds one by one from a mold cassette and sets each substrate-mold pair with a gap. The loader unit has a push pin for pushing out each substrate or mold, a cassette moving mechanism for moving a predetermined substrate or mold to the position of the push pin, an inner circumference receiving jig for receiving the substrate or mold pushed out by the push pin and holding the inner circumference of the substrate or mold, an inner circumference receiving jig moving mechanism for moving the inner circumference receiving jig to a predetermined position, and an outer circumference holding member for holding the outer circumference of the substrate or mold in a predetermined position and setting each substrate-mold pair with a gap. Substrates and molds can be set by the following method. As shown in FIG. 6, substrates and molds are pushed out alternately from the substrate cassette and the mold cassette by the push pins at S1 and S1'. The inner circumference receiving jig receives each substrate or mold at S2 and S2' and moves the substrate and mold to a predetermined position at S3 and S3'. In the predetermined position, the outer circumference holding member holds the outer circumference of the substrate or mold, and the inner circumference receiving jig is removed. In this position, the outer circumference holding member topples the substrates and molds over sideways alternately at S4 so that the substrates and molds are piled up alternately at S5.

Figure 7:
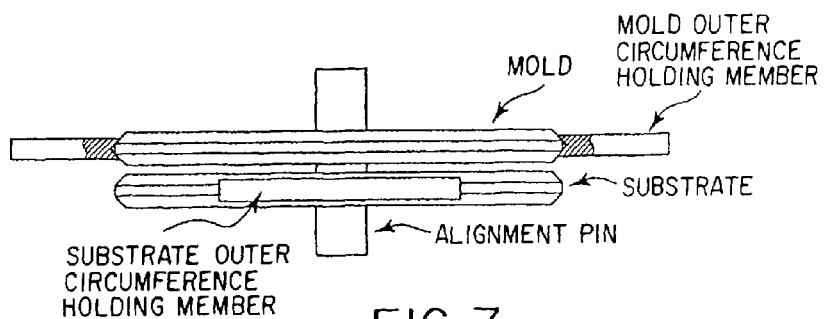
FIG. 7 is a view showing a state in which the substrate and the mold are set on an alignment pin.

The alignment unit includes an outer circumference holding hand, an assembling jig, a slider, a vertically operating cylinder, and a sensor. The outer circumference holding hand holds a substrate and a mold the outer circumferences of which are held by the outer circumference holding members through the portions of the outer circumference holding members. The assembling jig includes an alignment pin. The slider moves the substrate and the mold held by the outer circumference holding hand to a designated position in the assembling jig. The vertically operating cylinder puts the substrate and the mold onto the alignment pin. The sensor confirms that the substrate and the mold are set on the alignment pin. In the alignment unit, a substrate extracted from the cassette is held by the outer circumference holding hand, moved to a predetermined position by the slider, and lifted down by the vertically operating cylinder so that the substrate is put on the alignment pin. Then, after the hand holding the substrate is removed from the substrate and lifted up so that the hand is restored to its original place. Then, a mold is incorporated in the same manner from the opposite side. For example, a light-reflective sensor checks whether the substrate and the mold are set properly on the alignment pin as shown in FIG. 7.

Figure 8:
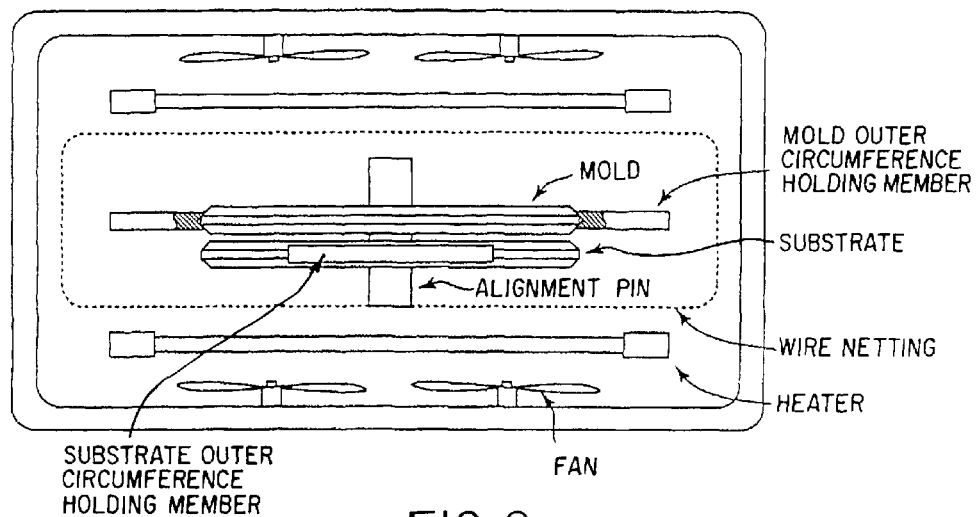
FIG. 8 is a view showing an example of a hot air type heating unit.
Figure 9:
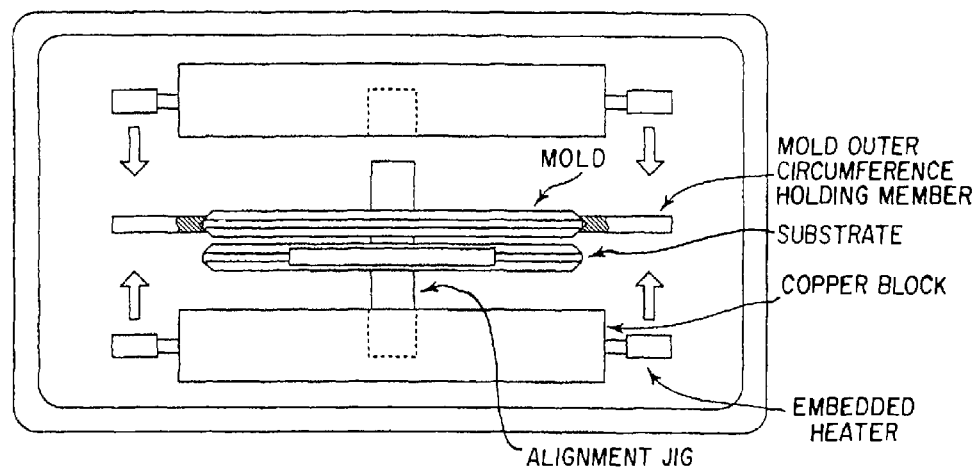
FIG. 9 is a view showing an example of a thermal block type heating unit.

The heating unit may be of a hot air type or may be of a thermal block type. FIG. 8 shows an example of a hot air type heating unit. FIG. 9 shows an example of a thermal block type heating unit.

In the hot air type heating unit, drafts from air fans are run through heaters to generate hot air blowing the workpiece (the assembling jig in which the substrate and the mold are incorporated) upward and downward. The hot air type heating unit is relatively easy to hold the temperature equally so that the hot air type heating unit can be applied to double-side imprinting. There is however a problem that it is impossible to increase the temperature rapidly because the temperature rise rate of the hot air type heating unit is about 1-10° C./sec.

In the thermal block type heating unit, heaters are embedded in copper blocks, so that the copper blocks heated to a designated temperature in advance are pressed against upper and the lower surfaces of the workpiece to thereby heat the workpiece. The thermal block type heating unit can heat the workpiece rapidly at a rate of 10-50° C./sec. There is however a disadvantage that it is difficult to hold the temperature equally when the thermal block type heating unit is applied to double-side imprinting because the substrate which cannot come into direct contact with the thermal blocks is slow in temperature rise. Accordingly, the thermal block type heating unit is used when the temperature needs to be increased rapidly up to a temperature near to a target temperature.

Figure 10A:
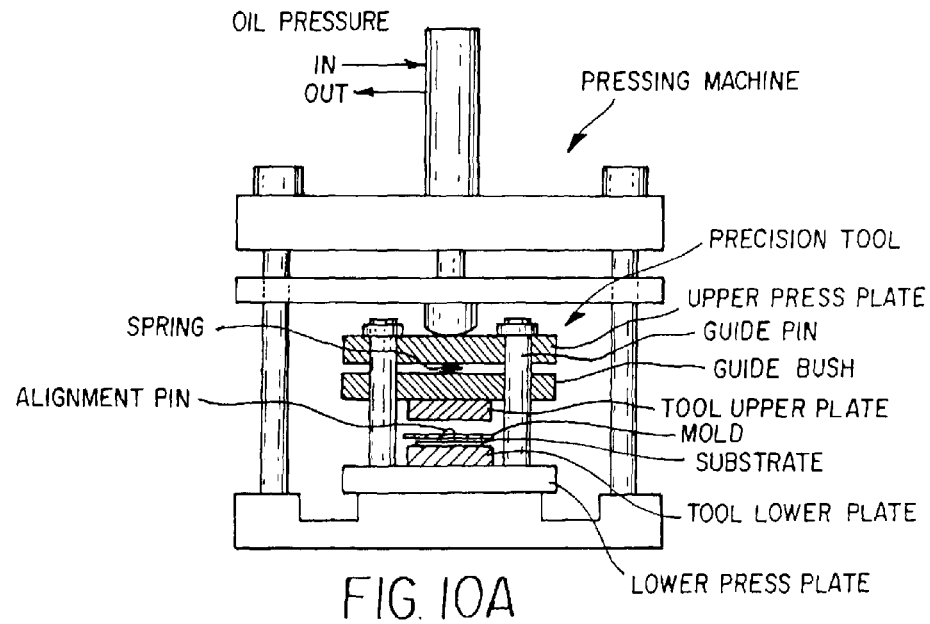
FIG. 10A is a side view showing a precision tool disposed in a pressing machine before pressing.
Figure 10B:
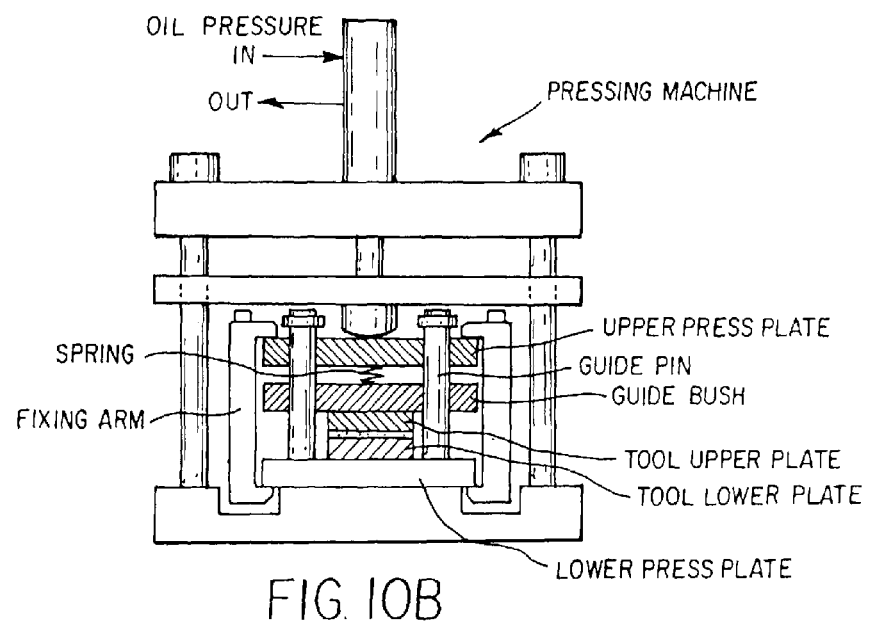
FIG. 10B is a side view showing the precision tool locked with fixing arms after pressing.
Figure 11:
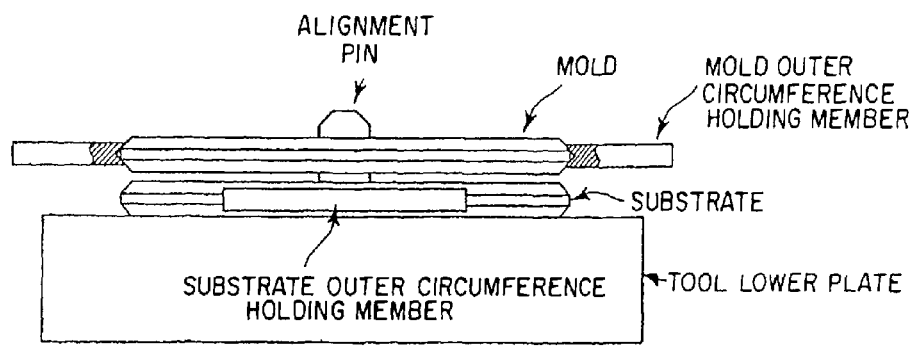
FIG. 11 is an enlarged side view of a portion where the substrate and the mold are incorporated in the precision tool.

As shown in FIGS. 10A and 10B, the press unit has a pressing machine, a precision tool (die set) set in the pressing machine, and fixing arms for locking the precision tool after pressing. Guide pins and guide bushes are incorporated in upper and lower press plates to prevent the precision tool from being pressed obliquely. FIG. 11 shows an enlarged view of a portion where the substrate and the mold are incorporated in the tool.

A spring is provided between the upper press plate and the guide bush board so as to be located in the central position (corresponding to the central holes of the substrate and the mold). The substrate-mold pair introduced into the press unit is mounted between the tool lower and upper plates of the precision tool on the lower press plate while the substrate and mold outer circumference holding members remain in the substrate-mold pair. The pressing machine applies a pressure of about 0.1 to 10 MPa to the substrate-mold pair. In the state where the pressing machine applies the pressure to the substrate-mold pair, fixing arms are attached to the precision tool. After the fixing arms are screwed up so that the precision tool is locked with the fixing arms, the locked precision tool is taken out and conveyed to the cooling unit. Because the guide pins and the guide bushes are incorporated in the upper and lower press plates of the precision tool, the pressure acts in a direction perpendicular to the patterned surface so that the minute pattern of the mold can be transferred to the resist accurately without destruction of the minute pattern.

Figure 12:
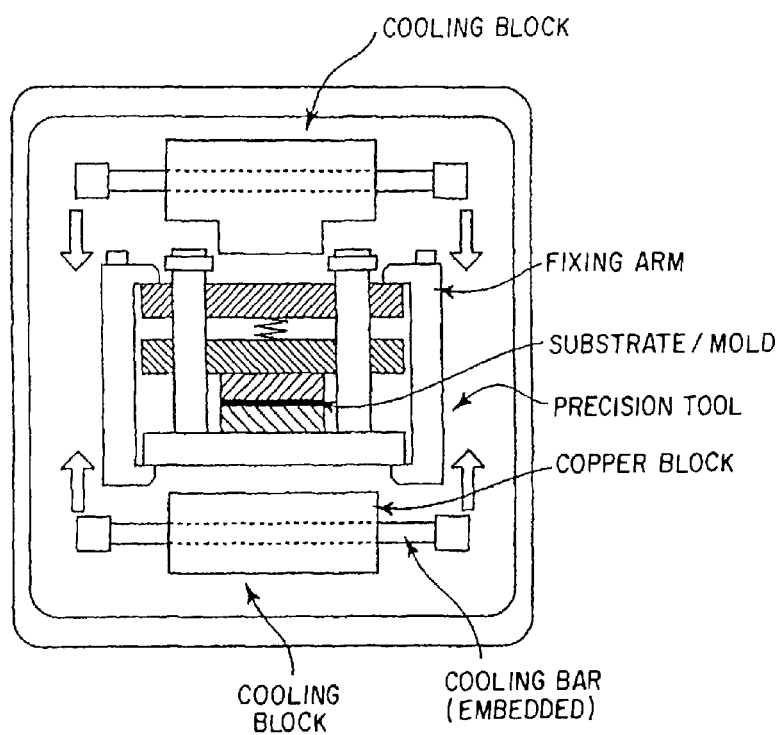
FIG. 12 is a view showing an example of a cooling unit.

A unit of a type for pressing cooling blocks against the upper and lower surfaces of the mold as shown in FIG. 12 can be used as the cooling unit. Copper blocks embedded with cooling bars into which hot or fresh water can be poured can be used as the cooling blocks.

Fresh or hot water at a designated temperature is poured into the cooling bars embedded in the copper blocks so that the copper blocks are set at the designated temperature. Moreover, the copper blocks are pressed against the upper and lower surfaces of the workpiece to cool the workpiece.

Although this cooling can be performed at one stroke in one step (one unit), this cooling may be preferably separated into two steps (two units) when the temperature of the mold to be cooled is relatively high because the heat capacity of the mold is large. For example, in the first unit, the copper blocks at a lower temperature than the target temperature of the workpiece are pressed against the workpiece to cool the workpiece to a temperature near to the designated temperature at one stroke. Then, in the second unit, the copper blocks at the same temperature as the target temperature of the workpiece are pressed against the workpiece to cool the workpiece to the designated temperature evenly.

Figure 13A:
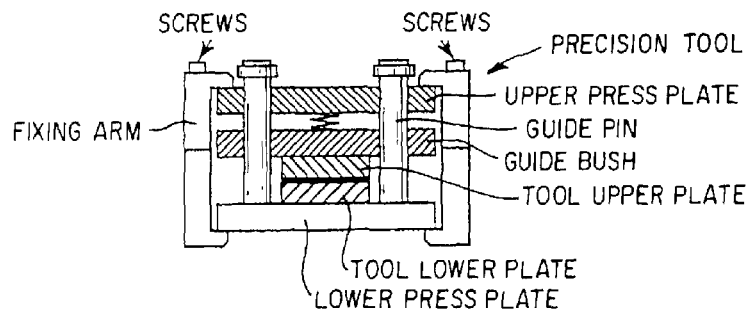
FIGS. 13A to 13E are views showing a releasing procedure in a release unit.
Figure 13B:
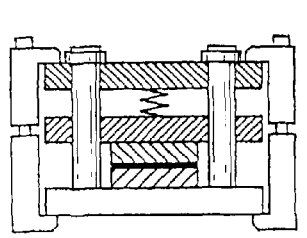
Figure 13C:
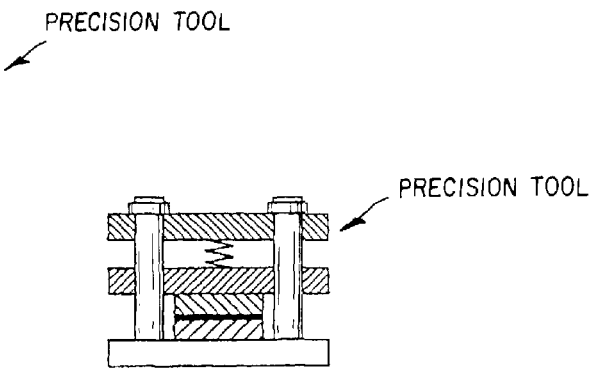
Figure 13D:
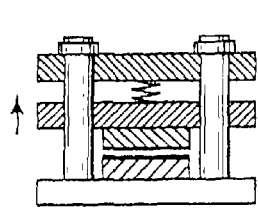
Figure 13E:
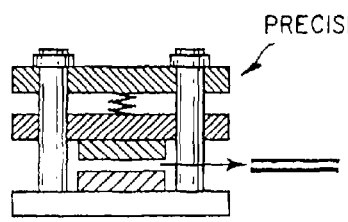
Figure 14:
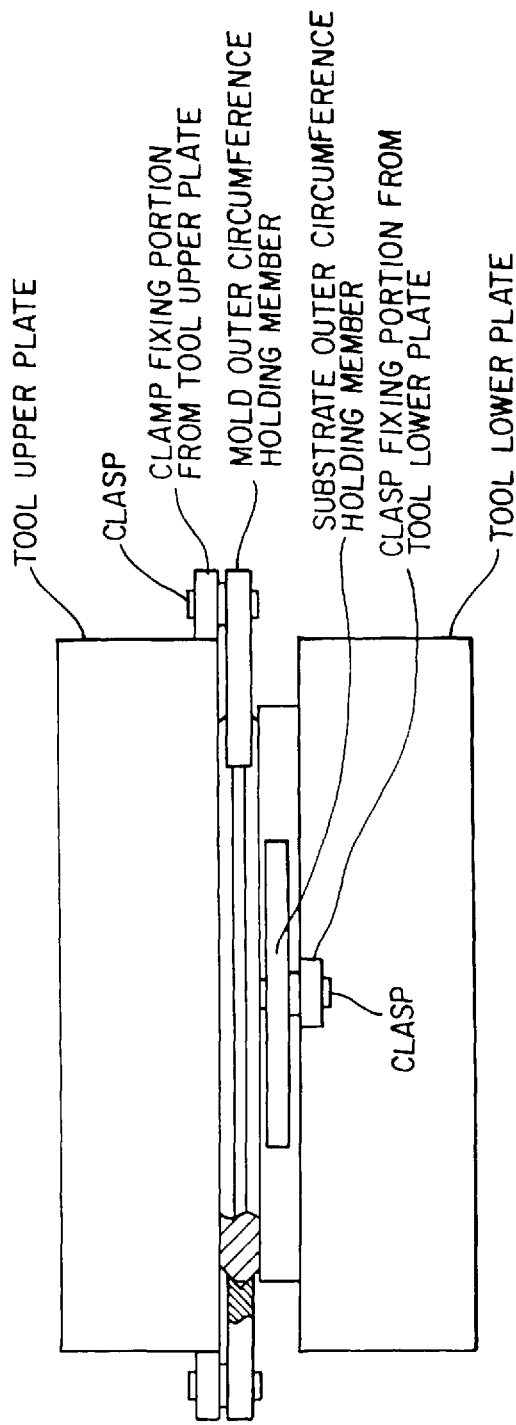
FIG. 14 is a view showing a state where mold and substrate outer circumference holding members are attached to tool upper and lower plates respectively.

FIGS. 13A to 13E show a releasing procedure in the release unit. In the release unit, the fixing arms of the precision tool are screwed down as shown in FIG. 13A and removed as shown in FIG. 13B. Then, the mold outer circumference holding member is attached to the tool upper plate and the substrate outer circumference holding member is attached to the tool lower plate as shown in FIG. 13C. Then, the tool upper plate is lifted up as shown in FIG. 13D so that the mold and the substrate are separated from each other. Because the upper surface of the tool upper plate is fixed to the lower surface of the guide bush board so that the guide bush board can move only vertically through the guide pins, the mold and the substrate are separated from each other in a direction perpendicular to the patterned surface. Then, the substrate and mold outer circumference holding members are removed from the precision tool and the substrate and the mold are removed from the substrate and mold outer circumference holding members respectively and conveyed to the unloader unit as shown in FIG. 13E. The precision tool is conveyed to the press unit.

In the unloader unit, the substrates and the molds after pattern imprinting are inserted one by one into cassettes respectively. The cassette containing a predetermined number of substrates is conveyed to the next process in the magnetic recording medium production while the cassette containing a predetermined number of molds is subjected to necessary processes such as cleaning and then conveyed to the loader unit.

Various devices such as a belt conveyor and a car type conveyor can be used as the conveying device. As is obvious from the above description, conveyance is performed in a state where the substrate-mold pair is fixed by the outer circumference holding members or by the precision tool.

Imprinting using this apparatus configuration is performed as follows. First, a substrate coated with a resist and a mold are put into the loader unit. Then, the substrate and the mold are conveyed to the alignment unit, so that the mold is aligned with the substrate by the alignment unit. Then, the substrate and the mold are conveyed to the heating unit, so that the substrate and the mold are heated to a temperature not lower than Tg of the resist by the heating unit. Then, while the temperature is kept to be not lower than Tg, the substrate and the mold are conveyed to the press unit so that the mold is pressed against the substrate by the press unit. Then, in the state where the mold is pressed against the substrate by the press unit to be in tight contact with the substrate, the mold and the substrate are conveyed to the cooling unit so that the mold and the substrate are cooled to a temperature not higher than Tg of the resist. Then, in the state where the press unit is removed and the mold and the substrate are in tight contact with each other, the mold and the substrate are conveyed to the release unit so that the mold is released from the substrate by the release unit. Then, the substrate having the patterned resist and the mold are conveyed to the unloader unit, so that the substrate and the mold are taken out from the unloader unit.

Into the loader unit from which the substrate and the mold have been already conveyed to the alignment unit, a next substrate and a next mold are put at appropriate timing in consideration of the time required for processing in each unit. Then, as the substrate and the mold move to the next step, a next substrate and a next mold are conveyed to a free unit in the same manner as described above. That is, the mold and the substrate paired with each other are processed in an assembly line in accordance with each step.

Figure 2:
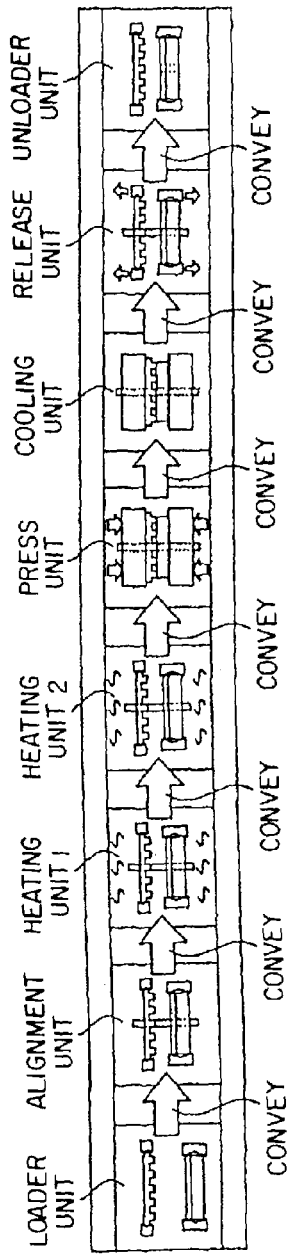
FIG. 2 is a view showing the configuration of an apparatus according to a second embodiment.

In the imprinting apparatus according to the invention, the heating unit may be separated into dual- or multi-stage heating units which are different in maximum achievable temperature. FIG. 2 shows an example of such configuration of the apparatus. That is, FIG. 2 shows an example in which the heating unit is separated into heating units 1 and 2. In a sense, it can be said that FIG. 2 shows an example in which two heating units are arranged in series.

In the example shown in FIG. 2, the heating unit is separated into dual- or multi-stage units ranging from a low temperature to a high temperature to avoid partial unevenness of temperature, and the tact time required for temperature rise is divided into tact times adjusted for the respective units to avoid production of wasteful time compared with the example shown in FIG. 1. This example is effective when a long time is required for heating.

Figure 3:
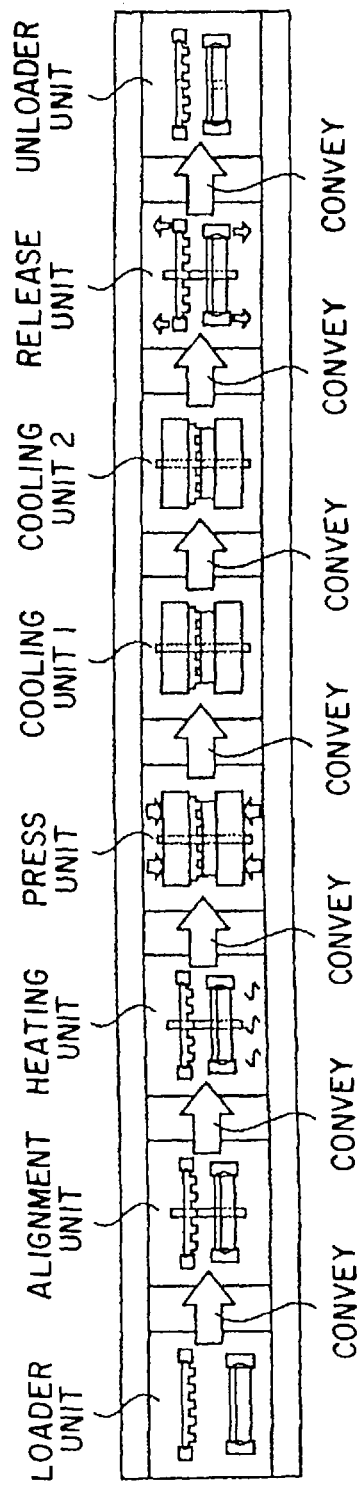
FIG. 3 is a view showing the configuration of an apparatus according to a third embodiment.

In the imprinting apparatus according to the invention, the cooling unit may be separated into dual- or multi-stage cooling units which are different in minimum achievable temperature. FIG. 3 shows an example of such configuration of the apparatus. That is, FIG. 3 shows an example in which the cooling unit is separated into cooling units 1 and 2.

In the example shown in FIG. 3, the cooling unit is separated into dual- or multi-stage units ranging from a high temperature to a low temperature to avoid partial unevenness of temperature, and the tact time required for temperature fall is divided into tact times adjusted for the respective units to avoid production of wasteful time compared with the example shown in FIG. 1. This example is effective when a long time is required for cooling.

It is a matter of course that the heating unit may be separated into dual- or multi-stage units ranging from a low temperature to a high temperature while the cooling unit may be separated into dual- or multi-stage units ranging from a high temperature to a low temperature.

In the apparatus shown in FIG. 1, all the units are independent units in each of which one step is executed. On the other hand, an apparatus shown in FIG. 4 includes a composite unit in which the cooling step and the release step are executed. For example, such a composite unit can be adapted to the case where the temperature at pressing is relatively low and the tact time required for cooling is short. When the tact time required for alignment is short and the tact time required for heating is short, the alignment step and the heating step may be performed in one composite unit.

Figure 5:
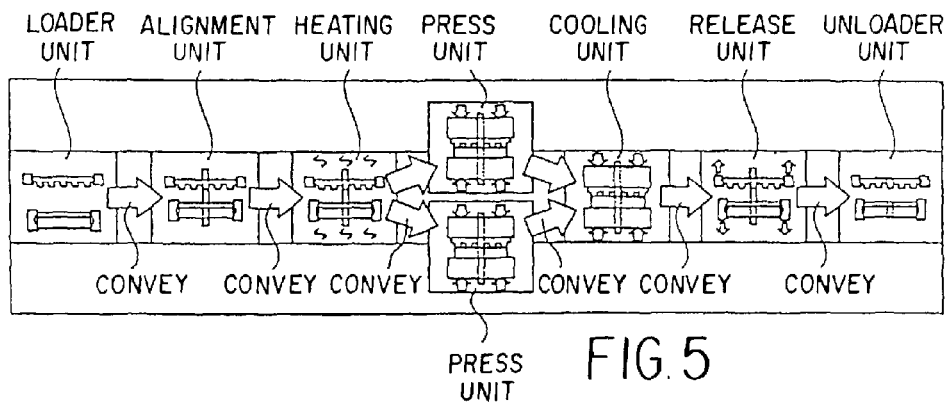
FIG. 5 is a view showing the configuration of an apparatus according to a fifth embodiment.

In the imprinting apparatus according to the invention, two or more units long in tact time may be arranged in parallel in accordance with the tact time of each unit. FIG. 5 shows an example of such configuration of the apparatus. Although FIG. 5 shows an example in which two press units are arranged in parallel, the invention is not limited thereto. For example, three press units may be arranged in parallel in accordance with the tact time, or two or more heating or cooling units may be arranged in parallel. Parallel connection type units which are arranged in parallel as described above may be used in combination with series connection type units such as the heating units or the cooling units which are arranged in series as described above so that one step can be performed in two or more units arranged in series.

Embodiments in which the imprinting apparatus according to the invention is applied to production of hard disks will be described below in detail. However, the invention is not limited to these embodiments and may be applied to any other mode belonging to the spirit of the invention.

As shown in FIG. 1, the imprinting apparatus according to the first embodiment is separated into seven zones, that is, a loader unit, an alignment unit, a heating unit, a press unit, a cooling unit, a release unit and an unloader unit. A mold and a substrate paired with each other are conveyed between the respective units to perform an imprinting process.

First, a mold having a pattern of projections and recesses formed in a transfer surface and a substrate coated with a thermoplastic resist were put into the loader unit. In the loader unit, the mold and the substrate were set in support jigs for holding outer diameters of the mold and the substrate. In this embodiment, a Ni electroformed mold having a diameter of 75 mm and a thickness of 0.3 mm was used as the mold. A pattern of concentric circles with a pitch of 100 nm and a pattern depth of 150 nm was formed in a range between an outer diameter of 47 mm and an inner diameter of 17 mm in a surface of the mold. A magnetic recording medium having an outer diameter of 48 mm and a central hole with a diameter of 16 mm and coated with a 100 nm-thick thermoplastic resist mr-I-8010E (made by Micro Resist Technology Gmbh) by a spin coater was used as the resist-coated substrate.

Then, the loaded mold and the loaded substrate paired with each other were conveyed to the alignment unit. When inner diameters of the substrate and the mold were put on an alignment jig (alignment pin) shaped like a pin in the alignment unit as shown in FIG. 7, the centers of the inner diameters of the substrate and the mold were aligned with each other. On this occasion, the support jigs supported the substrate and the mold in parallel and with a clearance to avoid restriction of the substrate and the mold to thereby permit alignment of the centers of the inner diameters of the substrate and the mold. When the alignment jig shaped like a pin was inserted into the substrate and the mold while the support jigs were moved vertically and horizontally, the centers of the inner diameters of the substrate and the mold could be aligned with each other in 10 seconds.

After alignment of the mold and the substrate, the mold and the substrate were fixed so as to prevent difference between the relative positions of the mold and the substrate. The mold and the substrate were conveyed to the heating unit in the state where the mold and the substrate were in tight contact with each other. A thermal block type heating unit using copper blocks as shown in FIG. 9 was used as the heating unit.

The mold and the substrate were heated to 160° C. in the heating unit. Heating was performed by bringing the copper block of 160° C. into contact with the rear surfaces of the mold and the substrate so that the mold and the substrate could be heated to 160° C. evenly in 10 seconds.

The mold and the substrate heated to 160° C. were conveyed to the press unit. As shown in FIGS. 10A and 10B, the mold and the substrate were set in the precision tool so that the patterned surface of the mold was pressed against the resist surface of the resist-coated substrate by the press plates under a predetermined pressure for a predetermined time. Because pressing was performed by the press plates, undulation of the substrate surface was formed to imitate the undulation of the mold surface while the resist was fluidized to the pattern of the mold. In this manner, a resist pattern uniform in the substrate surface was obtained. In addition, the precision tool thus pressed was fixed by the fixing arms. The precision tool thus pressed was kept for 5 seconds by pressing pressure of 4 MPa. A series of steps from conveyance to pressing the press plates for application of pressure of 4 MPa could be performed in 10 seconds.

Then, the mold and the substrate being in tight contact with each other in the precision tool fixed by the fixing arms were taken out together with the precision tool from the pressing machine and conveyed to the cooling unit.

The mold and the substrate were cooled to 100° C. by the cooling unit. In this embodiment, the copper blocks temperature-controlled to 100° C. or less by water cooling jackets were brought into contact with the rear surfaces of the mold and the substrate so that the mold and the substrate could be cooled to 100° C. in 10 seconds.

Then, the mold and the substrate cooled to 100° C. while brought into tight contact with each other were conveyed to the release unit in the state where the mold and the substrate were held so as not to be separated from each other. The mold and the substrate were released from each other in the procedure shown in FIGS. 13A to 13E.

In the release unit, the mold and the substrate were separated from each other by separating the support jigs of the substrate and the mold perpendicularly to the patterned surfaces of the mold and the substrate, and then the substrate and the mold were moved rapidly to leave a space of 4 mm between the substrate and the mold. The pattern of the resist formed thus was a pattern with a pitch of 100 nm. This step could be performed in 3 seconds after the substrate and the mold were set in the release unit.

Then, the mold and the substrate having the patterned resist were conveyed to the unloader unit, and unloaded by the unloader unit.

A series of operations from loading a substrate and a mold into the loader unit to unloading the substrate and the mold from the unloader unit were performed under reduced pressure by a series of apparatuses.

When a series of processes were performed thus on an assembly line by units assigned to the respective steps, patterned substrates could be produced at a throughput of 10 seconds per sheet.

When patterns are to be formed in opposite surfaces of a substrate, a copper block heated from the rear surface cannot be brought into contact with the rear surface of the substrate. In this case, the substrate is heated by hot air. It is however impossible to heat the substrate evenly from room temperature to 160° C. by hot air in 10 seconds.

The second embodiment is an example in which such a situation was assumed and heating using hot air was used as a heating method in the heating step.

As shown in FIG. 2, this embodiment is the same as the first embodiment except the heating unit. In this embodiment, the heating unit was separated into two heating units (i.e. heating unit 1 and heating unit 2) provided as series connection type units arranged in series. In the heating unit 1, the rear surface of a mold was heated by a copper block of 160° C. while a substrate was heated by hot air for 10 seconds. Then, the mold-substrate pair was conveyed to the heating unit 2. In the heating unit 2, the mold-substrate pair was held in hot air of 160° C. for 10 seconds. As a result of heating in the heating unit 1, the temperature of the mold reached to 160° C. as a whole but the temperature of the substrate varied from 120° C. to 160° C. in the surface of the substrate. When the mold and the substrate were held in hot air of 160° C. in the heating unit 2 in 10 seconds, the mold and the substrate could be heated to 160° C. evenly.

When a series of processes were performed thus on an assembly line by units assigned to the respective steps, patterned substrates could be produced at a throughput of 10 seconds per sheet.

In the third embodiment, a resist mr-I 7010E (made by Micro Resist Technology Gmbh) (Tg: 60° C.) was used as the thermal imprint resist. An imprint temperature of 160° C. and a release temperature of 60° C. are suitable for this resist. When this resist is used, a substrate-mold pair heated to 160° C. is hardly cooled to 60° C., for example, in 10 seconds by a single-stage cooling unit. Therefore, in this embodiment, the cooling unit was separated into two cooling units 1 and 2 provided as series connection type units arranged in series. As shown in FIG. 3, this embodiment was the same as the first embodiment except the cooling unit.

In the cooling unit 1, a copper block of 60° C. or lower was pressed against the rear surface of the mold and held for 10 seconds so that the mold was cooled. Thus, the temperature of the mold became 60° C. to 80° C. in the surface of the mold. In the second-stage cooling unit 2, cooling was performed by a copper block of 60° C. As a result, the mold and the substrate could be cooled to 60° C. evenly.

When a series of processes were performed thus on the opposite surfaces of the substrate on an assembly line by units assigned to the respective steps, patterned substrates could be produced at a throughput of 10 seconds per sheet.

In the fourth embodiment, a resist mr-I 9010E (made by Micro Resist Technology Gmbh) was used as the thermal imprint resist. This resist is of a heat-curable type so that specific Tg of the resist cannot be found. An imprint temperature of 120° C. and a release temperature of 100° C. are suitable for this resist. When this resist was used, a mold and a substrate could be cooled from the imprint temperature to the release temperature evenly in several seconds. Therefore, in the embodiment, the cooling step and the release step were performed in one composite unit as shown in FIG. 4. In this embodiment, operation from loading a substrate and a mold into the loader unit to conveyance of the substrate and the mold to the composite unit and operation after taking the substrate and the mold out of the composite unit were the same as those in the first embodiment.

Even if mold release was performed in the same unit immediately after cooling as shown in FIG. 4, patterned substrates could be produced at a throughput of 10 seconds per sheet.

In the fifth embodiment, a mold having a pattern pitch of 60 nm and a pattern depth of 40 nm was used as the mold. When the mold was used and imprinting was performed in the configuration of the apparatus shown in FIG. 1 in the same manner as in the first embodiment, a long time was required for pressing because it took a long time to fill the pattern with the resist. In this case, the time required for required for transferring the pattern completely was 15 seconds or longer whereas the time required for any other step was 10 seconds or shorter. As a result, the workpieces were retarded, so that the total tact time was forced to be lowered. On the other hand, when two press units were provided in parallel in this embodiment as shown in FIG. 5, the workpieces were distributed to the two press units successively. Consequently, total efficiency was improved so that patterned substrates could be produced at a throughput of 10 seconds per sheet.

The first embodiment is an example of the apparatus configuration in which the tact times of the respective steps are substantially equal to one another. The second and third embodiments are examples in which the tact time of a specific step is longer than any other step and in which two units are arranged in series for performing the specific step. In the second and third embodiments, three or more units may be arranged in series in accordance with the tact time of the specific step. The fourth embodiment is an example in which the tact time of a specific step is short and in which the specific step is combined with an adjacent step so that the specific step and the adjacent step can be performed by one composite unit. In the fourth embodiment, the specific step may be combined with a plurality of adjacent steps in accordance with the tact time of the specific step so that the specific step and the adjacent steps can be performed by one composite unit. The fifth embodiment is an example in which two press units are arranged in parallel for the press step long in tact time. In the fifth embodiment, three press units may be arranged in parallel in accordance with the tact time of the press step.

Although the second embodiment (FIG. 2) has shown an example in which a substrate having one surface coated with a resist is used, it is obvious that imprinting can be applied to a substrate having opposite surfaces each coated with a resist because heating is based on hot air.

The invention has been described with reference to certain preferred embodiments thereof. It will be understood, however, that modifications and variations are possible within the scope of the appended claims.

This application is based on, and claims priority to, Japanese Patent Application No: 2008-111762, filed on Apr. 22, 2008. The disclosure of the priority application, in its entirety, including the drawings, claims, and the specification thereof, is incorporated herein by reference.

What is claimed is:

1. An imprinting apparatus for carrying out an imprinting method for forming a predetermined pattern in a resist surface of a substrate coated with a thermal imprint resist by using a mold having a pattern of projections and recesses formed in a transfer surface, the imprinting apparatus comprising:
   a plurality of units which perform one or more steps in the imprinting method and which are selected from independent units in each of which one step is executed, composite units each of which a plurality of steps are executed, and combinations of independent units and composite units; and conveying devices which convey the mold and the substrate paired with each other between the plurality of units;

wherein the plurality of units include a loader unit, an alignment unit, a heating unit, a press unit, a cooling unit, a release unit, and an unloader unit;

wherein the heating unit is divided into dual- or multi-stage sub-units which are different in maximum achievable temperature;

wherein, in a first heating sub-unit, a first heating is performed by contacting a thermal block to the mold and blowing hot air to the substrate;

wherein, in a second heating sub-unit, a second heating is performed by hot air; and wherein, the mold and substrate are heated together and the entire substrate is heated during the first heating and the second heating.

2. An imprinting apparatus according to claim 1, wherein the cooling unit is divided into dual- or multi-stage units which are different in minimum achievable temperature.

3. An imprinting apparatus according to claim 1, wherein at least one of the units has two or more devices which are provided in parallel with each other, with each of the two or more devices performing steps of the same type.

4. An imprinting apparatus according to claim 2, wherein at least one of the units has two or more devices which are provided in parallel with each other, with each of the two or more devices performing steps of the same type.

5. An imprinting apparatus for carrying out an imprinting method for forming a predetermined pattern in a resist surface of a substrate coated with a thermal imprint resist by using a mold having a pattern of projections and recesses formed in a transfer surface, the imprinting apparatus comprising:

a plurality of units which perform steps in the imprinting method and which are selected from independent units in each of which one step is executed, composite units each of which a plurality of steps are executed, and combinations of independent units and composite units; and conveying devices which convey the mold and the substrate paired with each other between the plurality of units;

wherein the plurality of units include a loader unit, an alignment unit, a heating unit, a press unit, a cooling unit, a release unit, and an unloader unit;

wherein the cooling unit is divided into dual- or multi-stage sub-units which are different in minimum achievable temperature;

wherein, in a first cooling sub-unit, a first cooling is performed by a cooling block at a lower temperature than a target temperature; and wherein, in a second cooling sub-unit, a second cooling is performed by a cooling block at a temperature that is the same as the target temperature.

* * * * *